United States Patent [19]

Siuciak et al.

[11] Patent Number: 5,055,790
[45] Date of Patent: Oct. 8, 1991

[54] SSFP IMAGING TECHNIQUE WITH IMPROVED T1 CONTRAST

[75] Inventors: Alan M. Siuciak, Willoughby; Chandralekha Chatterjee, Richmond Heights; Neil D. Palmer, Euclid, all of Ohio

[73] Assignee: Picker International, Inc., Highland Heights, Ohio

[21] Appl. No.: 379,075

[22] Filed: Jul. 13, 1989

[51] Int. Cl.$^5$ ............................................ G01R 33/20
[52] U.S. Cl. ................................................... 324/309
[58] Field of Search ................ 324/307, 309, 311, 312

[56] References Cited

U.S. PATENT DOCUMENTS

| | | | |
|---|---|---|---|
| 4,449,097 | 5/1984 | Young et al. | 324/309 |
| 4,665,365 | 5/1987 | Glover et al. | 324/307 |
| 4,699,148 | 10/1987 | Gyngell | 128/653 |
| 4,707,653 | 11/1987 | Frahm et al. | 324/309 |
| 4,733,186 | 3/1988 | Oppelt et al. | 324/309 |
| 4,769,603 | 9/1988 | Oppelt et al. | 324/309 |
| 4,795,973 | 1/1989 | Zur et al. | 324/309 |

OTHER PUBLICATIONS

"Elimination of Transverse Coherences in Flash MRI" by Crawley et al., Mag. Res. in Med., 8, pp. 248–260, 1988.
"Optimization of Spoiler Gradients in Flash MRI" by Wood et al., Mag. Res. Imag., vol. 5, pp. 455–464, 1987.
"The Distinguishing Properties of Gradient-Recalled Acquisition in the Steady State (Grass)" by Wehrli et al., (one page).
"Diffusion and Field-Gradient Effects in NMR Fourier Spectroscopy" by R. Kaiser, E. Bartholdi and R. R. Ernst, Journal of Chem. Physics, vol. 60, No. 8, Apr. 15, 1974, pp. 2966–2979.

Primary Examiner—Michael J. Tokar
Attorney, Agent, or Firm—Fay, Sharpe, Beall, Fagan, Minnich & McKee

[57] ABSTRACT

A series of 90° RF pulses (50) are applied, each in the presence of a slab or slice select gradient (52) to excite nuclear magnetic spins in the selected slab. The spins are phase encoded (56). A preliminary read gradient (60) of one polarity and a primary read gradient (62) of the opposite polarity are applied to induce a gradient echo (64) during the primary read gradient. After the primary read gradient, a residual magnetization dephasing gradient pulse (66, 66') is applied, with an alternating polarity from cycle to cycle. The residual magnetization dephasing pulse has an area defined by the product of its duration and amplitude which is selected relative to the area of the preliminary and primary read gradient pulses such that the residual magnetization does not refocus during collection of the gradient echo data in later cycles.

18 Claims, 4 Drawing Sheets

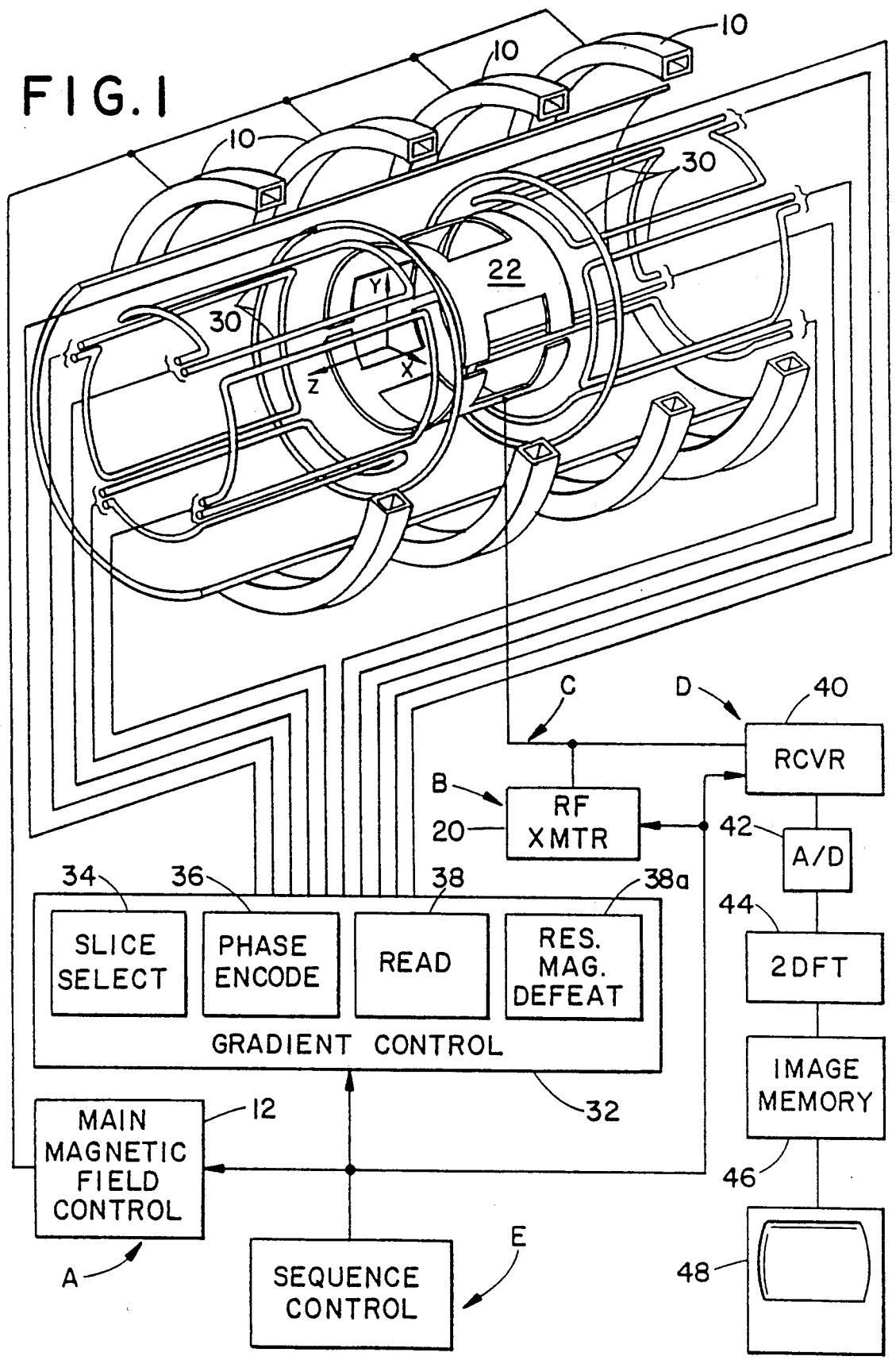

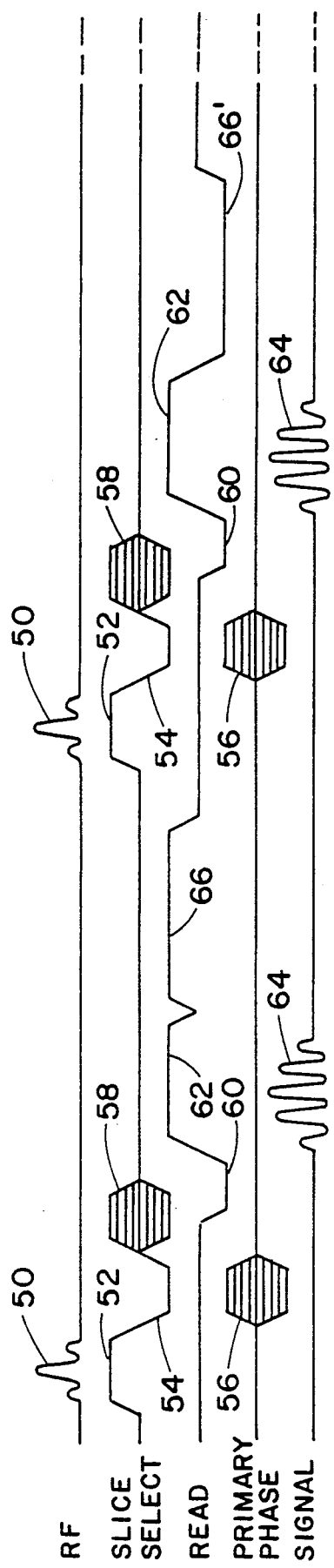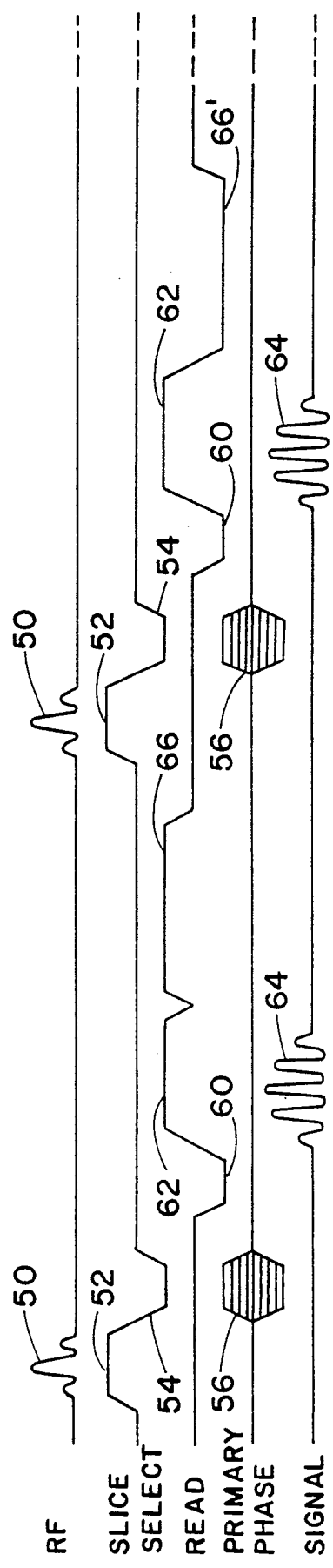

SSFP IMAGING TECHNIQUE WITH IMPROVED T1 CONTRAST

BACKGROUND OF THE INVENTION

The present invention relates to the magnetic resonance imaging techniques. It finds particular application in conjunction with steady state free precession (SSFP) techniques for imaging human patients and will be described with particular reference thereto. It is to be appreciated, however, that the invention may also find application in conjunction with other magnetic resonance applications.

In steady state free precession imaging, a 90° radio frequency pulse is applied concurrently with a slice or slab select gradient along a first axis. A rephasing pulse along the slice select direction follows, commonly concurrently with a primary phase encode gradient along a second or primary phase axis. Next, a dephasing gradient pulse is applied on the read axis. For three dimensional imaging, a secondary phase encode gradient along the slice select axis is applied concurrently with a dephasing gradient pulse on the read axis. A read gradient is applied during the time in which a resultant magnetic resonance echo is predicted. The area of the read gradient from its commencement to the center of echo is substantially the same as the area of the dephasing read gradient, but of the opposite polarity. The sequence is cyclically repeated with the next RF pulse applied immediately following the read gradient to compress the repeat time (TR).

In steady state free precession imaging, a series of phase coherent radio frequency (RF) pulses are applied to excite spins or resonance within a sample. The pulse separation is less than or comparable to the characteristic $T_2$ and $T_1$ times for the sample under investigation. As explained in greater detail in Kaiser, et al., "Diffusion and Field Gradient Effects in NMR Fourier Spectroscopy", *J. Chem. Phys.*, Vol. 60, p. 2966, (1974), the successive RF pulses split the magnetization into several components. One of these components represents the magnetization which has been in a transverse state for at least one repeat interval (TR). The algebraic sign of its accumulated spatial encoding is changed by each successive RF pulse.

Unfortunately, difficulties arise when applying SSFP principles in practice. The sequences which cause the magnetization to approach steady state free precession not only derive image intensity or contrast from the free induction decay following each RF pulse, but also from the residual transverse magnetization signals which persist from the previous RF excitations. At many locations within the object being imaged, the primary phase encode gradient, i.e. the gradient which changes amplitude between successive RF pulses effectively destroys coherence of the residual magnetization, hence, its contribution to subsequent primary echo views.

However, the coincidence of the residual magnetization is disturbed very little for locations that lie around the physical center of the phase encoding gradient. Thus, the residual magnetization contribution becomes relatively large adjacent this location.

More specifically, the dephasing read gradient pulse phase encodes the spins of the residual magnetization in the read gradient direction by an offset phase that is proportional to the area of the pulse. The read gradient being of the opposite polarity, cancels this phase encoding and returns it to zero at the center of the read gradient pulse, i.e. where the area of the read gradient pulse matches the area of the opposite polarity dephasing read gradient pulse. Because this is normally the center of the read gradient pulse, the same phase offset but with the opposite polarity is added by the last half of the read gradient pulse. The 90° RF pulse of the next repeat reverses the polarity of the phase offset matching it to the polarity of the next dephasing read gradient pulse. At the end of the read gradient dephasing pulse, the spins have acquired twice the phase offset. The primary read gradient has twice the area of the dephasing read gradient pulse and of the opposite polarity. Accordingly, this phase offset cancels at the end of the read gradient, causing the magnetization to refocus into a residual magnetization gradient echo.

This residual magnetization echo, centered at the end of the read gradient, superimposes residual magnetization data on the primary magnetic resonance view centered. In the next repetition, this residual magnetization component analogously refocuses in the center of the read gradient. Further, an additional residual magnetization component which commences with this cycle refocuses as described above to cause an echo at the end of the read gradient of the next repeat cycle. This process repeats, adding new residual magnetization components as older ones gradually decay in amplitude.

This causes the resulting image to exhibit regions of normal contrast where the coherence is destroyed by the phase encode gradients. Other regions of the image have progressively altered contrast at locations about the physical center of the phase encoding direction. These contrast changes correspond to, respectively, regions of predominantly $T_1$ contrast and regions where contrast is a function of both $T_1$ and $T_2$. Physically, this image contrast artifact appears as a high intensity bright band, commonly referred to as banding.

Two prior art methods are commonly practiced to preserve $T_1$ contrast In one method, the phasing or spoiling gradients are added after data sampling. The other method is to use small flip angles, rather than the 90° RF pulses. See U.S. Pat. No. 4,707,658, issued Nov. 17, 1987 to Frahm, et al. Both of these techniques reduce the amplitude of the residual magnetization.

Both of these methods, however, encounter difficulties. Applying spoiler gradient pulses after data collection places very large demands on the gradient amplifiers, restricting sequence performance. Further, with very short repeat times and large flip angles, the spoiler gradients may not completely suppress the signal from the residual magnetization. Intensity artifacts still appear in the image. Using smaller flip angles has the undesirable effect of reducing the degree of $T_1$ contrast relative to 90° flip angles.

Another technique for removing intensity artifacts is shown in U.S. Pat. No. 4,699,148 of Gyngell. A rephasing gradient pulse on the phase encode axis is applied to counteract the effects of the primary phase encoding pulse. Although this method has been successful, it does have certain drawbacks. Specifically, the overall image contrast is a function of both $T_1$ and $T_2$. For some applications, $T_1$ weighted contrast is desired, rendering the Gyngell images less advantageous.

Another method for removing intensity artifacts is described in "Artifacts Due to Residual Magnetization in Three Dimensional MRI", M. L. Wood, et al., *Medical Physics*, Vol. 50, pp. 825-31 (1988). Wood rotates the intensity bands into the slice direction and then offsets the slice such that it does not coincide with the physical center of the slice select gradient. The described Wood technique successfully removes intensity artifacts from two dimensional Fourier transform SSFP sequences without introducing $T_2$ contrast. However, the Wood method does not work with three dimensional Fourier transform SSFP sequences. Wood has also proposed that a large static gradient pulse applied after data collection on each axis, in conjunction with a rephasing phase encode pulse on the primary phase axis would eliminate intensity artifacts and $T_2$ weighted contrast in three dimensional SSFP sequences. In practice, this technique requires prohibitively large static pulses at magnetic field strengths greater than 0.5T to eliminate the $T_2$ weighted contrast associated with rephasing the phase encode pulse.

As illustrated by U.S. Pat. No. 4,795,978 to Zur, et al., intensity artifacts for three dimensional SSFP sequences can be removed with hardware modifications.

The present invention contemplates a new and improved magnetic resonance technique which overcomes the above referenced problems and others.

SUMMARY OF THE INVENTION

In accordance with the present invention, a method of steady state free precession magnetic resonance imaging of a selected region of a subject is provided. A static magnetic field is created through the selected region. Cyclically, a radio frequency pulse is applied, at least one gradient pulse is applied, and a magnetic resonance view is collected. More specifically, the RF pulse excites nuclear magnetic resonance or spin in a selected region. The gradient pulse encodes the excited spins, hence the collected views. Following each view collection, a magnetic field gradient is applied which prevents residual magnetization from the present and preceding cycles from refocusing during the view collecting step of the next cycle. The collected views are then reconstructed into an image representation.

In accordance with a more limited aspect of the present invention, the residual magnetization dephasing gradient alternates polarity with each repetition.

In accordance with another more specific aspect of the present invention, the residual magnetization dephasing gradients each increase the phasing of the residual magnetization progressively more in each repetition. In this manner, the residual magnetization arising in each repetition becomes more and more dephased in each subsequent cycle.

One advantage of the present invention is that it removes the effects of residual magnetization.

Another advantage of the present invention is that it operates efficiently in both two and three dimensional steady state free precession imaging techniques.

Another advantage of the present invention is that it facilitates the formation of T1 weighted images.

Yet another advantage of the present invention is that it enables large flip angles such as 90° flip angles to be utilized, yet minimizes gradient amplifier power demands.

Still further advantages of the present invention will become apparent to those of ordinary skill in the art upon reading and understanding the following detailed description of the preferred embodiments.

BRIEF DESCRIPTION OF THE DRAWINGS

The invention may take form in various steps and arrangements of steps and in various parts and arrangements of parts. The drawings are only for purposes of illustrating a preferred embodiment and are not to be construed as limiting the invention.

FIG. 1 is a diagrammatic illustration of a magnetic resonance imaging apparatus in accordance with the present invention;

FIG. 2 is a diagrammatic illustration of a three dimensional Fourier transform imaging technique in accordance with the present invention;

FIG. 3 is a diagrammatic illustration of a two dimensional imaging sequence in accordance with the present invention;

DETAILED DESCRIPTION OF THE PREFERRED EMBODIMENT

Figure 4:
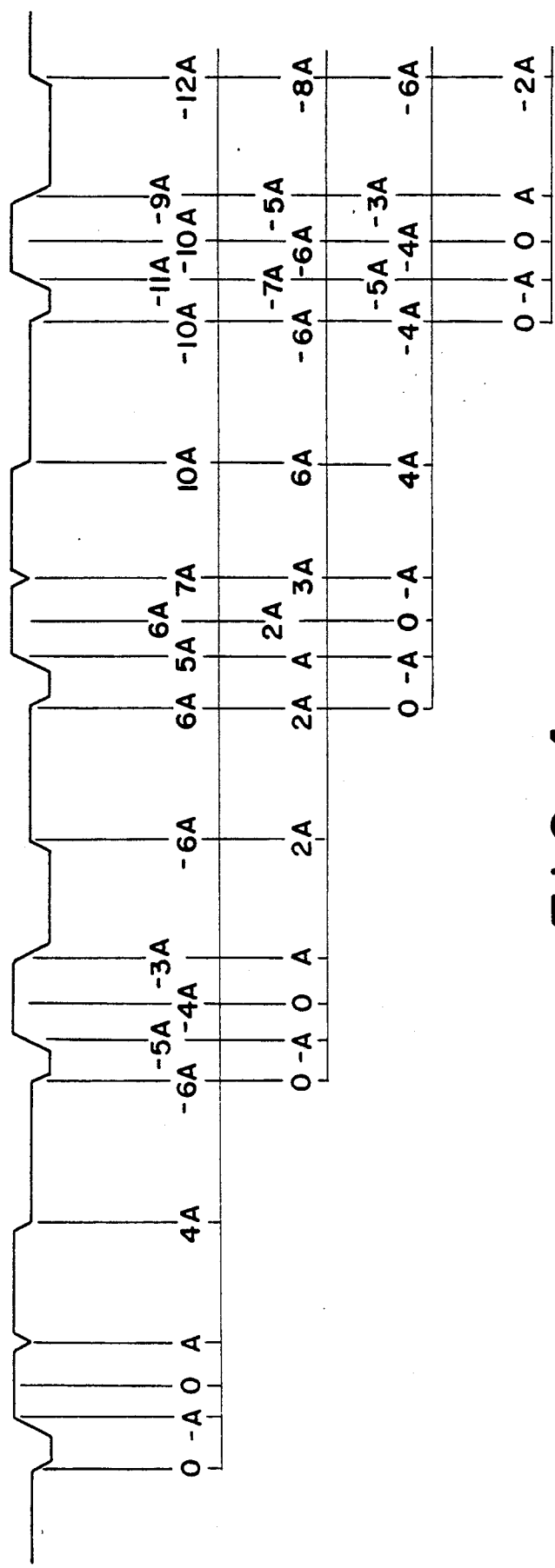
FIG. 4 is a diagrammatic illustration of the phase progression of residual magnetic resonance from view to view.

A main magnetic field means A including a plurality of resistive or superconducting magnets 10 and a magnet controller 12 creates a strong, substantially uniform static magnetic field through an examination region 14. A magnetic resonance excitation means B including a radio frequency transmitter 20 and a radio frequency coil 22 selectively excites spins or resonance in the magnetization of dipoles of a subject within the examination region. A gradient field means C encodes the spins or resonance. The gradient field means includes a plurality of gradient field coils 30 which convert current pulses to gradient field pulses along selected axes, preferably three mutually orthogonal axes. A gradient field control means 32 includes a slice select gradient control means 34 for causing slice select gradients along one axis and a phase encode gradient means 36 for creating phase encode gradients along another axis. A read gradient means 38 applies gradients along a third axis. A residual magnetization dephasing gradient means 38a applies alternate polarity pulses along the read gradient for defusing the effects of residual magnetization.

A view generating means D receives magnetic resonance signals and creates corresponding electrical signals or views. Induced magnetic resonance has an appropriate radio frequency to be received by the radio frequency coil 22 and the radio frequency receiver 40. Optionally, the receiver may be connected with a surface coil to receive resonance from a more specific portion of the subject. An analog-to-digital converter 42 converts the received resonance signals into digital data views for processing by appropriate computer circuitry. A Fourier transform means 44 operates on the received views with a two or three dimensional Fourier transform, as may be appropriate to the selected imaging procedure, to generate an electronic image representation. The electronic image representation may be stored in an image memory 46, displayed on a video monitor 48, subject to further processing, archived on tape or disk, or the like.

A sequence control means E operates the resonance excitation and gradient field control means in accordance with preselected sequences, such as the sequence of FIG. 2. An RF pulse 50 is applied concurrently with a slice or slab select gradient 52 to excite spins in the selected slice slab of the body. The radio frequency and slice select pulses are chosen such that the Larmor frequency of protons in the center of the desired slab are at the frequency of the RF pulse under the applied gradient pulse. A dephasing pulse 54 is applied to cancel the effects of dephasing across the slab incurred during the slab selection process. The slab or slice dephasing pulse has the same area or amplitude times duration but is of the opposite polarity. A primary phase encode gradient pulse 56 is applied after the slice select pulse, preferably concurrently with the slice select dephasing gradient pulse 54. In different repetitions of the sequence, the primary phase encode gradient assumes different ones of preselected phase encode gradient steps to encode spatial information along the phase encode direction in the resonance excited within the slab or slice.

A secondary phase encode gradient 58 is applied along the slab select direction subsequent to the slab select rephasing pulse 54. The secondary phase encode gradient again assumes each of a plurality of phase encode gradient steps. Typically, the primary phase encode gradient changes steps with each repetition of the cycle and the secondary phase encode gradient steps after the primary gradient has assumed each of its steps. This process is repeated until the secondary phase encode gradient has assumed all of its steps.

In the third orthogonal direction, a preliminary or dephasing read gradient pulse 60 is applied prior to data collection. A primary read gradient pulse 62 of opposite polarity is applied during data collection. The read gradient pulses are timed then sized such that a gradient echo 62 is produced at a selected point during the read gradient 60. Typically, the dephasing read gradient 58 is of the opposite polarity and has half the area such that the gradient echo occurs in the center of the primary read gradient pulse 62.

After the primary read gradient, a residual magnetization dephasing read gradient pulse 66 is applied. The residual magnetization dephasing pulse is dimensioned to prevent the residual magnetization from refocusing during data collection in a later view. The area of the dephasing read gradient pulse 66 is selected relative to the areas of the preliminary and primary read gradient pulses in order to prevent residual magnetization from forming into an echo at a time in which it would interfere with the next or other subsequent sequences.

In the preferred embodiment, the residual magnetization dephasing gradient pulse is three times the area of the gradient pulse 60. This sequence is repeated for each of the plurality of phase encodings. However, in each repetition, the polarity of the residual magnetization dephasing phase encode gradient is reversed. That is, in the next subsequent sequence, the same pulses are applied, except that the read direction residual magnetization dephasing pulse has a reversed polarity 66'.

With reference to FIG. 3, two dimensional imaging uses substantially the same sequence, except the secondary phase encode gradient pulse is eliminated. The "third" dimension of each voxel is the width of the selected slice.

With reference to FIG. 4, the phase of a first residual magnetization component is zero after the RF pulse 50. The preliminary read gradient increases the phase of this component in proportion to its area to a phase $-A$, where A is a value of phase proportional to the area of the pulse. The primary read gradient alters the phase as well. Because it is of the opposite polarity, it moves the phase back towards zero, reaching zero when the primary read gradient pulse area matches the area of preliminary gradient pulse 60. At zero phase, the gradient echo 64 occurs. However, the magnetization remains and acquires phase from this remainder of the primary read gradient pulse. For a primary read gradient pulse which has an area twice that of the preliminary pulse 60, the phase becomes A at the end of the primary read gradient. At the end of the residual magnetization dephasing pulse 66 which in the embodiment of FIGS. 2 and 3 is three times the preliminary read gradient pulse 60, the phase has grown to 4A.

At the start of the next repetition, the RF pulse reverses the polarity or sign of the phase from 4A to $-4A$. The preliminary read gradient pulse 60 increases the phase to $-5A$. The primary read gradient pulse reduces the phase to $-3A$. The opposite polarity residual magnetization dephasing pulse increases the phase to $-6A$. Because the phase never crosses zero, no gradient echo is produced. As will be seen in FIG. 4, carrying out this sequence causes the phase to continue growing larger in each repetition, never crossing zero. It is also to be appreciated that this component is decaying and will die out after several cycle repetitions.

In the second cycle, a second magnetization component is introduced with zero phase encoding. After the preliminary read gradient pulse 54 phase is again $-A$, the phase crosses zero, causing a gradient echo 64 in the middle of the data collection read gradient pulse and reaches $+A$ by the end of the read gradient pulse. The second or opposite polarity residual magnetization dephasing pulse 66 pushes the polarity to $-2A$. Although the polarity crosses zero allowing a gradient echo to occur, the gradient echo is sufficiently out of the data collection region that it does not degrade the collected views. In subsequent repetitions, this phase again continues to diverge, becoming further and further from zero, eventually decaying out.

In each subsequent cycle repetition, the residual magnetization is handled analogously. Magnetizations commencing in odd repetitions follow the first described sequence, and those commencing in even numbered repetitions follow the second described sequence.

It is to be appreciated that analogous results can be obtained with other sizes of the residual magnetization dephasing pulse or by adjusting the size of other read gradient pulses, particularly the data collection read gradient pulse. For example, the residual magnetization dephasing pulse can be shortened to $2\frac{1}{2}$ times the preliminary read gradient pulse without superimposing residual magnetization directly on the data collection region. However, as the residual magnetization echoes approach the data collection window, it becomes more probable that residual magnetization building toward an echo will achieve significant amplitude within the data collection window. If the dephasing pulse is shortened to twice the preliminary pulse size, the magnetization crosses zero in the second or even sequence, at the end of the preliminary pulse. For time efficiency, the beginning of the primary read gradient is at the end of the preliminary pulse. Because the echo grows over half of the read gradient pulse to a collectable magnetization, the last half the residual echo would add to the first half of the desired echo degrading a collected view. If the size of the dephasing pulse is the same size as the preliminary read gradient pulse, an echo would be formed in the center of the read gradient pulse of the next repetition. This superimposes a residual magnetization echo on top of the desired echo 64.

Figure 5:
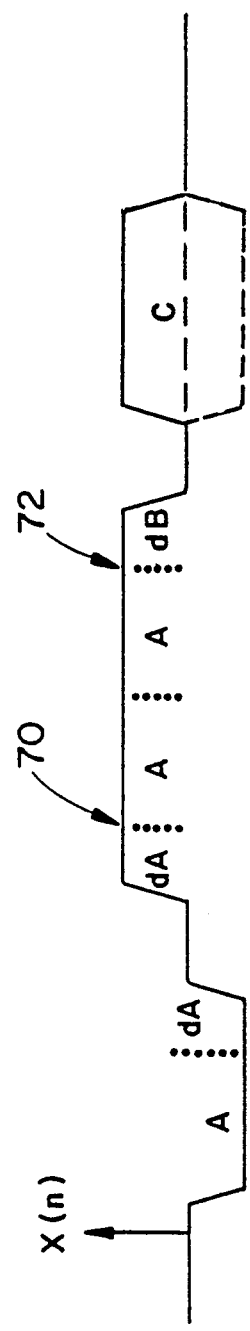
FIG. 5 illustrates a generalized gradient pulse sequence.

With reference to FIG. 5, the read gradient pulse sequence may be described generically. The length of the preliminary read gradient can be lengthened by adding a component dA, which, perforce adjusts at the primary read gradient by the same amount, lest the trailing end of the echo be clipped off. Primary read gradient pulses can be further lengthened by adding additional component dB to the end. Using this diagram, a generic solution or description of the residual magnetization dephasing gradient is derived.

Two cases must be considered, the case where the dephasing gradient pulse of area C is greater than zero in view 1 and the case where the dephasing gradient pulse is less than zero in view 1. In this discussion, view 1 refers to the first view where a given magnetization component is excited (this is not necessarily view 1 of the scan, however). The two cases must be considered due to the fact that each view generates an identical set of echoes in subsequent views but the spoiler is different from view to view.

For the case of C is greater than zero in view 1, the phase at point X(n) in all subsequent views (n) is given by:

$$\text{even view } (n=2m): P[X(n)] = -A - dB - (n-1)C \quad (1)$$

$$\text{odd view } (n=2m+1): P[X(n)] = (n-1)C \quad (2).$$

$m = 1, 2, 3, 4, \ldots$

For the case C is less than zero in view 1, the relations are:

$$\text{even view } (n=2m): P[X(n)] = -A - dB + (n-1)C \quad (3)$$

$$\text{odd view } (n=2m+1): P[X(n)] = -(n-1)C \quad (4).$$

$m = 1, 2, 3, 4, \ldots$

The objective of the method is to keep the residual magnetization generated by view 1 from forming an echo peak in the data collection of a later view. Data collection occurs during the two lobes of area A in FIG. 5, taking the magnetization between phases $-A(-Kx)$ to $+A(+Kx)$. This implies that, at the point X(n) of an odd/even view, the residual magnetization generated by view 1 must have an accumulated phase P[X(n)] in the frequency encoding direction which satisfies one of two conditions:

$$P[X(n)] \leq 0 \text{ then } P \leq -(i+1)A \quad (5a)$$

$$P[X(n)] \geq 0 \text{ then } P \geq (i-1)A \quad (5b)$$

otherwise the residual magnetization forms an echo peak in the data collection window of that particular view n.

The value i in these relations represents the number of phase shifts of area A that are desired for the residual magnetization. This corresponds to the number of ½ data areas (each of area A) away from which the residual magnetization echo peak will be formed. For the case i=0, an echo peak can potentially form at the very beginning 70 or very end of data sampling 72, or in other words, ½ the data collection area away from the center of data collection. In general, the value of "i" represents a span of $(i/2 + \frac{1}{2})$ data collection areas between the center of data collection and the closest residual magnetization echo peak.

Analysis of relation (1) indicates that it is negative for all n, thus the limit of concern is relation (5a) which gives:

$$C > 0; (n=2m): (n-1)C \geq 1A - dB \quad (6).$$

Analysis of relation (2) indicates that it is positive for all n and the only limit of concern is relation (5b) which gives:

$$C > 0; (n=2m+1) (n-1)C \geq (i+1)A \quad (7).$$

Since both even views (n=2m) and odd views (n=2m+1) are to be satisfied simultaneously, the larger of relations (6) and (7) is taken as the C>0 solution for all n.

For C<0 relation (4) is negative for all n and the limit of concern is relation (5a) which gives:

$$C < 0; (n=2m+1): (n-1)C \geq (i+1)A \quad (8).$$

Relation (3) can take on both negative and positive values depending on the values of dB and n and, therefore, requires special treatment. Two cases are discerned which are $C \geq A + dB$ and C is less than $A + dB$.

Taking the case $C \geq A + dB$, relation (3) is always positive and thus must satisfy the limit (5b) which gives the condition:

$$C < 0 (n=2m): (n-1)C \geq (i+2)A + dB \quad (9).$$

Relation (9) simultaneously satisfies relation (8) for all i and n, thus meeting the conditions to be a valid solution of the case C<0 (even/odd views simultaneously satisfied).

Next, the case $C < A + dB$ shows the phase P[X(n)] given by relation (3) can switch from negative to positive during the course of the scan. This indicates that in view n=2(m), the limit (5a) must be satisfied which gives:

$$(2m-1)C \leq -1A + dB \ (10) \ n = 2(m) \quad (10a)$$

and in view n=2(m+1) the limit (5b) must be satisfied which gives:

$$(2m+1)C \geq (i+2)A + dB \ (10) \ n = 2(m+1) \quad (10b).$$

For C to satisfy both of these relations in going from one even view to the next even view, it can be shown upon subtraction of (10b) from (10a) that:

$$C \geq (i+1)A \quad (11).$$

a relation independent of n. For P[X(n)] less than zero, the condition which also must be met comes from relation (3) subject to the limit (5a) which gives:

$$C < 0; (n=2m): (n-1)C \leq -1A + dB \quad (12)$$

which places an upper limit on the value of C. Thus, another solution which satisfies relation (8) and, therefore, the case where C is less than zero, is:

$$(i+1)A \leq C \leq (-1A + dB)/(n-1) \ (10) \ n = 2m \quad (13).$$

The case C<0 has been shown to yield two independent solutions, the first given by relation (9) and the second as given by relation (13). Note relation (13) can yield an additional solution if:

$$-1A + dB \geq (i+1)A \quad (14)$$

To summarize, the conditions to be met for the individual Cases are given by relations (6) and (7) (C>0) and (8), (9), and (13) (case C<0):

Case C>0:

$$C \geq (1A - db)/(n-1) \ (10) \ n=2m \quad (15a)$$

$$C \geq (i+1)A/(n-1) \ (10) \ n=2m+1 \quad (15b)$$

Case C<0:

$$C \geq ((1+2)A + dB)/(n-1) \ (10) \ n=2m \quad (16a)$$

or $$(i+1)A \leq C \leq (-1A + dB)/(n-1) \ (10) \ n=2m \quad (16b)$$

$$C \geq (i+1)A/(n-1) \ (10) \ n=2m+1 \quad (16c).$$

In relations (15a) through (16c), dA and dB are arbitrary areas enabled before and after data sampling respectively. They may take on any positive, real value, i.e. $dA \geq 0$ and $dB \geq 0$.

Finally, any valid solutions to the individual cases (C<0 and C>0) must also satisfy both cases simultaneously. Therefore, any solutions which satisfy both even and odd views of the cases C>0 and C<0 simultaneously are valid solutions and satisfy the limits set forth in relation (5).

To demonstrate the following relations choose the case $i=0$, $dA=0$, and $dB=0$. The relations (15a) and (15b) yield for the case C>0:

$$C \geq 0 \ (10) \ n=2m \quad (17a)$$

$$C \geq A/(n-1) \ (10) \ n=2m+1 \quad (17b).$$

The larger of these for all n is $C \geq A/2$.

For the case C is less than 0, equations (16a), (16b), and (16c) give:

$$C \geq 2A/(n-1) \ 10) \ n=2m \quad (18a)$$

$$A \leq C \leq 0 \ (10) \ n=2m \quad (18b)$$

$$C \geq A/(n-1) \ (10) \ n=2m+1 \quad (18c).$$

Since relation (18b) cannot be satisfied, there is only one solution for the case C is less than 0 given by the greater of relations (18a) and (18c), $C \geq 2A$.

Therefore, a solution which satisfied both even and odd views for the cases C is greater than 0 and C is less than 0 simultaneously is $C \geq 2A$.

For the specifications $i=0$, $dA=0$, and $dB=A$, relations (15a) and (15b) give for the C is greater than 0 case:

$$C \geq -A/(n-1) \ (10) \ n=2m \quad (19a)$$

$$C \geq A/(n-1) \ (10) \ n=2m+1 \quad (19b)$$

The maximum for all n is $C \leq A/2$.

Relations (16a), (16b), and (16c) give for the C is less than 0 case:

$$C \geq 3A/(n-1) \ (10) \ n=2m \quad (20a)$$

$$A \leq C \leq A/(n-1) \ (10) \ n=2m \quad (20b)$$

$$C \geq A/(n-1) \ (10) \ n=2m+1 \quad (20c)$$

Figure 6:
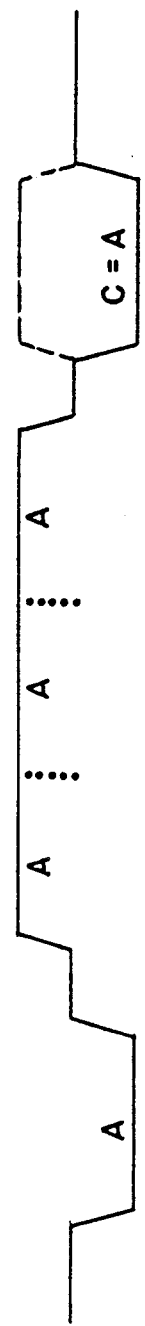
FIG. 6 is an alternate embodiment of a gradient pulse sequence in accordance with the present invention; and, FIG. 7 is another alternate embodiment of a gradient pulse sequence.
Figure 7:
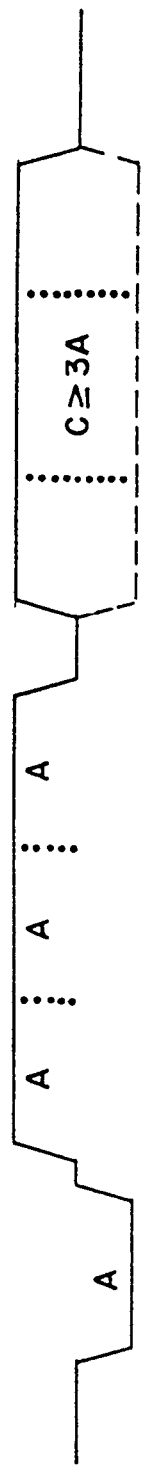

Relations (20a) and (20c) yield one solution, $C \geq 3A$, which also satisfies the case C is greater than 0, and therefore is a valid solution. However, relation (20b) can also be satisfies in this case by taking C=A exactly. This also satisfied the case C is greater than 0 and therefore is another independent solution. These two independent solutions yield the two profiles (FIGS. 6 and 7).

Other profiles may be generated by taking different values of i, dA, and dB. In general, i, dA and dB may vary continuously between 0 and infinity.

It is a preferred embodiment of the method to:
(1) Take $dA=0$ and $dB=0$. This is intended to minimize gradient duty cycles.
(2) Take $i=1$. This is intended to minimize interference between the main echo and the residual magnetization echo. In essence, this limits the lowest frequency associated with the residual magnetization echo to be equal to or greater than the highest frequency associated with the main echo. With these conditions, relations (15a) and (15b) give for the case C>0:

$$C \geq A/(n-1) \ (10) \ n=2m \quad (21a)$$

$$C \geq 2A/(n-1) \ (10) \ n=2m+1 \quad (21b).$$

The maximum of these relations for both even/odd views and all n is $C \geq A$.

For the case C is less than 0:

$$C \geq 3A/(n-1) \ (10) \ n=2m \quad (22a)$$

$$A \leq C \leq -A/(n-1) \ (10) \ n=2m \quad (22b)$$

$$C \geq 2A/(n-1) \ (10) \ n=2m+1 \quad (22c).$$

Since relation (22b) cannot be satisfied, there is only one solution for C less than 0 in this case and is given by relations (22a) and (22c), $C \geq 3A$. Thus, to satisfy both the cases C is greater than 0 and C is less than 0, the pulse C must be greater than or equal to 3A. This yields the read profile in FIG. 2 which is the unique solution for the conditions $i=1$, $dA=0$, and $dB=0$.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A method of steady state free precession magnetic resonance imaging of a selected region of a subject, the method comprising:
   a) creating a static magnetic field through the selected region;
   b) applying an RF excitation pulse in the presence of a slab selection magnetic field gradient to excite nuclear magnetic spins in the selected region;
   c) after the slab selection magnetic field gradient, applying at least one rephasing magnetic field gradient pulse which compensates for dephasing of spins due to the slab selection magnetic field gradient;
   d) applying at least one magnetic field gradient pulse to encode the excited spins;
   e) detecting the encoded spins to generate a magnetic resonance view;
   f) applying a residual magnetic resonance dephasing gradient pulse to prevent (i) residual magnetization from preceding cycles and (ii) residual magnetization from a present cycle from refocusing during the detecting step of the next cycle;
   g) cyclically repeating steps (b) through (f) to generate a plurality of views with a plurality of encodings;
   h) reconstructing an image representation from the views.

2. The method as set forth in claim 1 wherein the step of applying the residual resonance dephasing gradient pulse includes alternating the polarity of the residual magnetization dephasing gradient pulse in each cyclic repetition.

3. A method of steady state free precession magnetic resonance imaging of a selected region of a subject, the method comprising:
   a) creating a static magnetic field through the selected region;
   b) applying an RF excitation pulse to excite nuclear magnetic spins in the selected region;
   c) applying a preliminary gradient pulse along a read axis and a primary read gradient pulse along the read axis to encode the excited spins to induce a gradient echo signal during the primary read gradient pulse;
   d) detecting the gradient echo signal to generate a magnetic resonance view;
   e) applying a residual magnetic resonance dephasing gradient pulse to prevent (i) residual magnetization from preceding cycles and (ii) residual magnetization from a present cycle from refocusing during the detecting step of the next cycle;
   f) cyclically repeating steps (b) through (e) to generate a plurality of views with a plurality of encodings;
   g) reconstructing an image representation from the views.

4. The method as set forth in claim 3 wherein the step of applying the residual magnetization dephasing gradient pulse includes applying a gradient pulse along the read direction with a polarity that alternates with each cycle.

5. A method of steady state free precession magnetic resonance imaging of a selected region of a subject, the method comprising:
   a) creating a primary magnetic field through the selected region;
   b) applying an RF excitation pulse to excite nuclear magnetic spins in the selected region;
   c) applying a preliminary gradient pulse along a read axis and a primary read gradient pulse along the read axis to encode the excited spins and induce a gradient echo signal during the primary read gradient pulse;
   d) detecting the gradient echo signal to generate a magnetic resonance view;
   e) applying a residual magnetic resonance dephasing gradient pulse along the read direction with a polarity that alternates with each cycle to prevent (i) residual magnetization from preceding cycles and (ii) residual magnetization from a present cycle from refocusing during the detecting step of the next cycle, the preliminary read gradient pulse, the primary read gradient pulse, and the residual magnetization dephasing gradient pulse each having a duration and an amplitude whose product defines an area thereof, the area of the residual magnetization dephasing pulse having an area selected relative to the areas of the preliminary and primary read gradient pulses such that the residual magnetization from a present cycle does not refocus within the primary read gradient pulse of a next cycle;
   f) cyclically repeating steps (b) through (e) to generate a plurality of views with a plurality of encodings;
   g) reconstructing an image representation from the views.

6. The method as set forth in claim 5 wherein the residual magnetization dephasing pulse area is more than twice the preliminary read gradient pulse area.

7. The method as set forth in claim 5 wherein the area of the residual magnetization dephasing pulse is at least three times the preliminary read gradient pulse area.

8. The method as set forth in claim 5 wherein the primary read gradient area is at least three times the preliminary read gradient area and the residual magnetization dephasing pulse area is substantially equal to the preliminary read gradient pulse area.

9. The method as set forth in claim 5 wherein the area of the preliminary read gradient pulse is $A + dA$, the area of the primary read gradient pulse is $2A + dA + dB$, and the area of the residual magnetization dephasing pulse is C and satisfies at least one of the relationships:

$$C \geq (1A - dB)/(n-1) \ (10) \ n = 2m$$

$$C \geq (i+1)A/n - 1) \ (10) \ n = 2m + 1$$

when C has the same polarity as the primary read gradient and satisfies at least one of the relationships:

$$C \geq ((1+2)A + dB)/n - 1) \ (10) \ n = 2m$$

or $$(i+1)A \leq C \leq (-1A + dB)/(n-1) \ (10) \ n = 2m$$

$$C \geq (i+1)A/(n-1) \ (10) \ n = 2m + 1$$

when the residual magnetization dephasing pulse has the opposite polarity from the primary read gradient.

where m is a number of the view within a sequence and equals 1, 2, 3, 4, ... etc., and i is the minimum number of phase shifts of area A that residual magnetization echoes are to be separated from each view.

10. A method of magnetic resonance imaging comprising:
applying a series of phase coherent radio frequency pulses to a selected region of a subject in the presence of a static magnetic field which defines an axis of equilibrium magnetic alignment within the subject such that nuclear magnetic spins are excited in the selected region;
after each radio frequency pulse:
applying a preliminary magnetic field gradient pulse along a read axis and a primary read gradient pulse along the read axis to encode the excited spins and induce a magnetic resonance echo during the primary read gradient pulse,
detecting the magnetic resonance echo to define a current view, and,
applying at least one magnetic field gradient to prevent residual magnetization from the current view from refocusing within the data collection of a later view;
reconstructing an image representation from the views.

11. A method of magnetic resonance imaging comprising:
applying a series of phase coherent radio frequency pulses to a selected region of a subject in the presence of a slab selection magnetic field gradient such that nuclear magnetic spins are excited in the selected region;
after each slab selection magnetic field gradient, applying at least one magnetic field gradient pulse:
to encode the excited spins,
to compensate for dephasing of spins due to the slab selection magnetic field gradient, and,
to prevent residual magnetization from a current view from refocusing within the data collection of a later view;
detecting the encoded spins to define a current view;
reconstructing an image representation from the views.

12. The method as set forth in claim 11 wherein the step of applying at least one magnetic field gradient includes applying a phase encoding gradient.

13. The method as set forth in claim 11 wherein the step of applying at least one magnetic field gradient includes applying a primary read gradient pulse during the detection of encoded spins.

14. The method as set forth in claim 13 further including before the primary read gradient pulse, applying a preliminary read gradient pulse of opposite polarity to cause a gradient echo signal during the primary read gradient pulse.

15. The method as set forth in claim 14 wherein the at least one magnetic field gradient applying step further includes applying a residual magnetization dephasing pulse that alternates in polarity from view to view.

16. A method of magnetic resonance imaging comprising:
applying a series of phase coherent radio frequency pulses to a selected region of a subject in the presence of a slab select magnetic field such that nuclear magnetic spins are excited in the selected region;
after each radio frequency pulse:
applying at least one rephasing magnetic field gradient pulse which compensates for dephasing of spins due to the slab selection magnetic field gradient,
applying at least a phase encoding gradient to encode the excited spins,
applying a gradient to induce a gradient echo signal,
applying a primary read gradient pulse during the gradient echo signal and detecting the gradient echo signal to define a current view, and,
applying a residual magnetization dephasing pulse that alternates in polarity from view to view to prevent residual magnetization from the current view from refocusing within the data collection of a later view;
the echo inducing gradient, the primary read gradient, and the residual magnetization dephasing gradient pulses each having a duration and an amplitude whose produce defines an area, the total area being chosen such that the residual magnetization from the current view does not refocus during the primary read gradient of a later view;
reconstructing an image representation from the views.

17. The method as set forth in claim 16 wherein the reconstructing step includes applying a multi-dimensional Fourier transform.

18. A magnetic resonance imaging apparatus comprising:
means for creating a static magnetic field through a region of a subject to be imaged;
a radio frequency means for applying a series of phase coherent radio frequency pulses to the region to excite nuclear magnetic spins therein;
a gradient magnetic field means for creating magnetic field gradients within the region for encoding the excited spins and for creating preliminary read gradients and primary read gradients along a read axis to induce gradient echo signals during the primary read gradients;
a radio frequency receiver means for receiving the gradient echo signals during the primary read gradients to collect a series of views;
the gradient magnetic field means further including a residual magnetization dephasing gradient pulse means for applying a gradient field pulse after view collection which prevents residual magnetization from a current view from refocusing during collection of a subsequent view;
an image reconstruction means for reconstructing an image representation of the region from the collected views.

* * * * *